United States Patent
Mikami et al.

(10) Patent No.: US 12,259,408 B2
(45) Date of Patent: Mar. 25, 2025

(54) SEMICONDUCTOR LASER INSPECTION APPARATUS

(71) Applicant: Mitsubishi Electric Corporation, Tokyo (JP)

(72) Inventors: Yohei Mikami, Tokyo (JP); Tetsuhiro Fukao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 126 days.

(21) Appl. No.: 18/004,228

(22) PCT Filed: Dec. 3, 2020

(86) PCT No.: PCT/JP2020/045110
§ 371 (c)(1),
(2) Date: Jan. 4, 2023

(87) PCT Pub. No.: WO2022/118444
PCT Pub. Date: Jun. 9, 2022

(65) Prior Publication Data
US 2023/0273241 A1  Aug. 31, 2023

(51) Int. Cl.
G01R 1/44 (2006.01)
G01R 31/26 (2020.01)
H01S 5/00 (2006.01)

(52) U.S. Cl.
CPC ........... *G01R 1/44* (2013.01); *G01R 31/2601* (2013.01); *H01S 5/0014* (2013.01)

(58) Field of Classification Search
CPC ....... G01N 21/01; G01N 2021/0106; H01L 21/67; H01L 21/67248; H01S 5/02; H01S 5/02315; H01S 5/02469; H01S 5/06804

USPC ..................................... 324/750.03
See application file for complete search history.

(56) References Cited

U.S. PATENT DOCUMENTS

| 4,993,482 A | 2/1991 | Dolbear et al. |
| 5,744,976 A | 4/1998 | Caggiano et al. |
| 6,429,669 B1 | 8/2002 | Ito et al. |

(Continued)

FOREIGN PATENT DOCUMENTS

| JP | H07-111283 A | 4/1995 |
| JP | H08-196058 A | 7/1996 |

(Continued)

OTHER PUBLICATIONS

Espacenet translation of JP H1090345 A (Year: 1998).*
International Search Report issued in PCT/JP2020/045110; mailed Feb. 22, 2021.
An Office Action; "Notice of Reasons for Refusal," mailed by the Japanese Patent Office on Sep. 7, 2021, which corresponds to Japanese Patent Application No. 2021-524967 wiith Partial English language translation.

(Continued)

*Primary Examiner* — Alesa Allgood
*Assistant Examiner* — Courtney G McDonnough
(74) *Attorney, Agent, or Firm* — Studebaker Brackett PLLC

(57) ABSTRACT

A semiconductor laser device (2) is placed on a first heating-cooling device (1). A probe holder (4) is attached on a second heating-cooling device (3), A measurement probe (8) is fixed to a distal end of the probe holder (4). A fine movement table (9) moves the second heating-cooling device (3) and the probe holder (4) so that a distal end of the measurement probe (8) contacts the semiconductor laser device (2). An inspection apparatus (10) inputs an inspection signal to the semiconductor laser device (2) through the measurement probe (8).

2 Claims, 11 Drawing Sheets

(56) References Cited

U.S. PATENT DOCUMENTS

| | | | |
|---|---|---|---|
| 2001/0026572 A1* | 10/2001 | Shimizu | G01R 31/2635 |
| | | | 372/45.01 |
| 2002/0172243 A1 | 11/2002 | Ono et al. | |
| 2003/0222670 A1 | 12/2003 | Hamada | |
| 2009/0160472 A1* | 6/2009 | Segawa | H01L 21/67248 |
| | | | 324/750.04 |

FOREIGN PATENT DOCUMENTS

| | | |
|---|---|---|
| JP | H10-90345 A | 4/1998 |
| JP | 2001-091548 A | 4/2001 |
| JP | 2002-344056 A | 11/2002 |
| JP | 2003-344498 A | 12/2003 |
| JP | 2008-204975 A | 9/2008 |
| JP | 2016-125983 A | 7/2016 |

OTHER PUBLICATIONS

An Office Action; "Decision of Refusal," mailed by the Japanese Patent Office on Dec. 7, 2021, which corresponds to Japanese Patent Application No. 2021-524967 with Partial English language translation.

An Office Action; "Notice of Reasons for Refusal," mailed by the Japanese Patent Office on Aug. 16, 2022, which corresponds to Japanese Patent Application No. 2021-167353 with Partial English language translation.

An Office Action mailed by the United States Patent and Trademark Office on Jun. 25, 2024, which corresponds to U.S. Appl. No. 18/150,657 and is related to U.S. Appl. No. 18/004,228.

* cited by examiner

SEMICONDUCTOR LASER INSPECTION APPARATUS

FIELD

The present disclosure relates to a semiconductor laser inspection apparatus and a semiconductor laser inspection method that inspect the characteristics of a semiconductor laser device with a probe brought into contact with the semiconductor laser device.

BACKGROUND

A diced semiconductor laser device is placed on a jig including a heating-cooling device and is subjected to characteristic inspection in contact with a probe. When the probe at room temperature contacts the heated or cooled semiconductor laser, the characteristics of the semiconductor laser device vary due to the temperature difference therebetween and measurement variance occurs. For this, a technology of heating the probe to the temperature of a semiconductor wafer by a heating apparatus at inspection of the wafer has been disclosed. Accordingly, it is possible to prevent heat removal from the semiconductor wafer and reduce measurement variance. Moreover, it is possible to reduce deformation of the probe at contact and stabilize the contact.

However, conventionally, the heating apparatus has been provided separately from the probe, and thus the probe has needed to be heated by the heating apparatus again after inspection. For this, an inspection apparatus in which the heating apparatus is attached to the probe has been disclosed (refer to PTL 1, for example).

CITATION LIST

Patent Literature

[PTL 1] JP H10-90345 A

SUMMARY

Technical Problem

To cool a probe, a Peltier element needs to be installed on the probe. The size of a typical Peltier element is equal to or larger than 10 mm×10 mm. The size of a probe used for semiconductor inspection typically includes the diameter of 1 mm and the length of 20 to 30 mm approximately. Thus, no space in which the typical Peltier element is provided is available near the probe. In a case of a Peltier element having a smaller size, it is difficult to externally extend a covered wire through which current flows to the Peltier element. When a Peltier element is installed on a probe, a support component that supports them generates heat, and thus a cooling mechanism of water cooling or the like is needed. However, only a hole having a diameter of several millimeters approximately is opened at the support component, which allows flow of only a small amount of cooling water, and thus sufficient cooling is impossible. As a result, the probe cannot be cooled and the characteristics of a semiconductor laser device cannot be prevented from varying at contact with the probe.

The present disclosure is intended to solve the above-described problem and obtain a semiconductor laser inspection apparatus and a semiconductor laser inspection method that are capable of preventing the characteristics of a semiconductor laser device from varying at contact with a probe.

Solution to Problem

A semiconductor laser inspection apparatus according to the present disclosure includes: a first heating-cooling device on which a semiconductor laser device is placed; a second heating-cooling device; a probe holder attached on the second heating-cooling device; a measurement probe fixed to a distal end of the probe holder; a fine movement table moving the second heating-cooling device and the probe holder so that a distal end of the measurement probe contacts the semiconductor laser device; and an inspection apparatus inputting an inspection signal to the semiconductor laser device through the measurement probe.

Advantageous Effects of Invention

In the present disclosure, the semiconductor laser device is placed on the first heating-cooling device, and the probe holder is attached on the second heating-cooling device, Since the first and second heating-cooling devices are capable of controlling temperature not only to the high temperature side but also to the low temperature side, the temperature of the semiconductor laser device and the temperature of the measurement probe can be made close to each other. Accordingly, the characteristics of the semiconductor laser device can be prevented from varying at contact with the measurement probe.

DESCRIPTION OF EMBODIMENTS

A semiconductor laser inspection apparatus and a semiconductor laser inspection method according to the embodiments of the present disclosure will be described with reference to the drawings. The same components will be denoted by the same symbols, and the repeated description thereof may be omitted.

Embodiment 1

Figure 1:
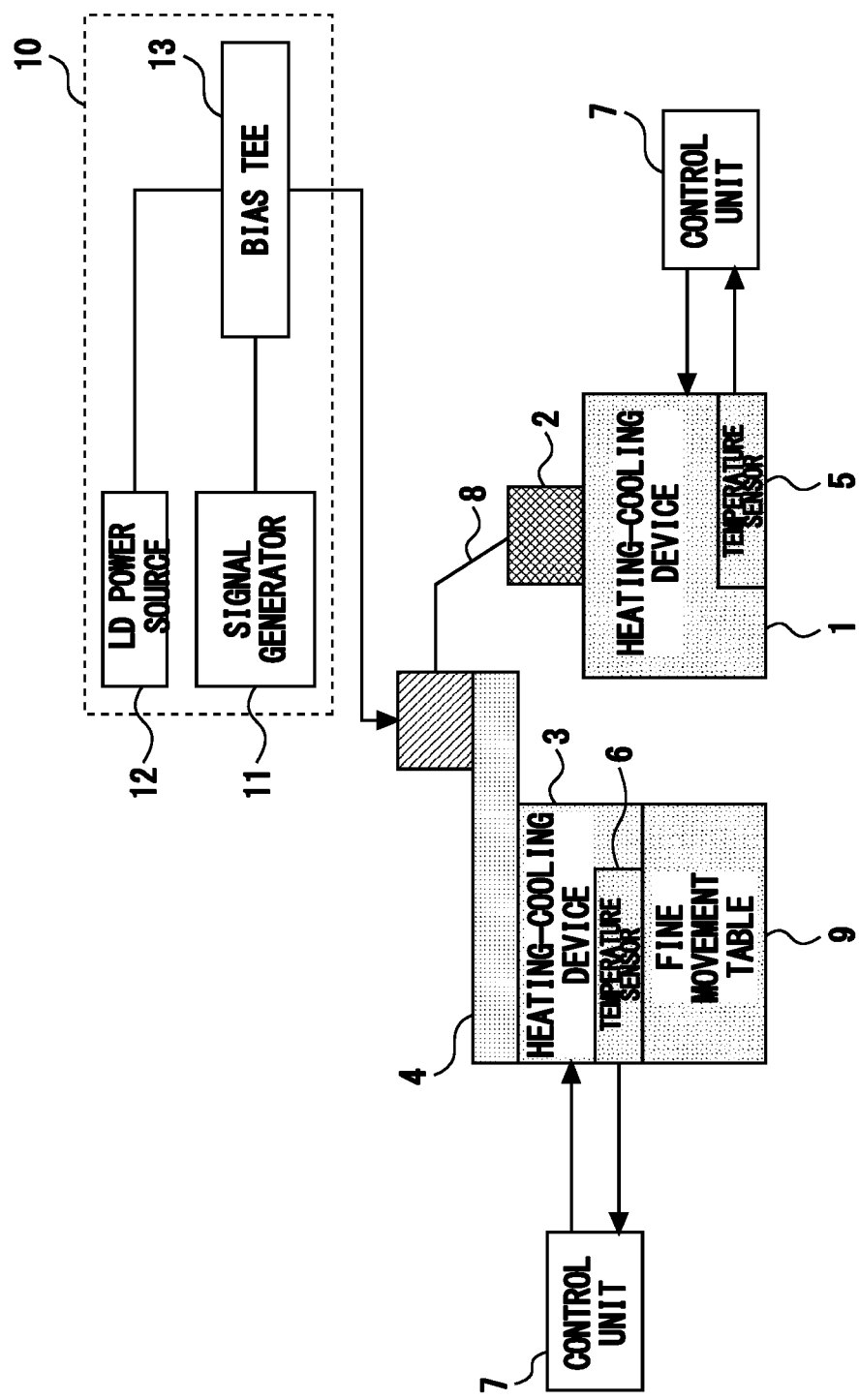
FIG. 1 is a block diagram illustrating a semiconductor laser inspection apparatus according to Embodiment 1.

FIG. 1 is a block diagram illustrating a semiconductor laser inspection apparatus according to Embodiment 1. A heating-cooling device 1 is a stage on which a semiconductor laser device 2 is placed. A probe holder 4 is attached on a heating-cooling device 3. The heating-cooling device 1 and the heating-cooling device 3 each include, for example, a Peltier element capable of controlling temperature not only to the high temperature side but also to the low temperature side.

A temperature sensor 5 is built in the heating-cooling device 1 and measures the temperature of the heating-cooling device 1. A temperature sensor 6 is built in the heating-cooling device 3 and measures the temperature of the heating-cooling device 3. In the present embodiment, a control unit 7 sets the temperature of the heating-cooling device 1 and the temperature of the heating-cooling device 3 to the same value based on measurement results of the temperature sensors 5 and 6.

A measurement probe 8 is fixed to the distal end of the probe holder 4. A fine movement table 9 moves the heating-cooling device 3 and the probe holder 4 in the up-down direction and the horizontal direction so that the distal end of the measurement probe 8 contacts the semiconductor laser device 2 placed on the heating-cooling device 1.

An inspection apparatus 10 includes a signal generator 11, an LD drive power source 12, and a bias tee 13. A modulated signal output from the signal generator 11 and constant voltage output from the LD drive power source 12 become an inspection signal through coupling at the bias tee 13. The inspection apparatus 10 inputs the inspection signal to the semiconductor laser device 2 through the measurement probe 8. The semiconductor laser device 2 is driven by the inspection signal to perform characteristic inspection of the semiconductor laser device 2.

Note that, when measurement is performed at room temperature lower than 25° C., dew condensation occurs to the measurement probe 8 or the semiconductor laser device 2 and characteristic value variation or short circuit during the measurement potentially occurs. Thus, the entire apparatus needs to be enclosed in a box made of acrylic or the like and filled with dry air or $N_2$ to prevent dew condensation.

In the present embodiment, the semiconductor laser device 2 is placed on the heating-cooling device 1, and the probe holder 4 is attached on the heating-cooling device 3. Since the heating-cooling device 1 and the heating-cooling device 3 are capable of controlling temperature not only to the high temperature side but also to the low temperature side, the temperature of the semiconductor laser device 2 and the temperature of the measurement probe 8 can be made close to each other. Accordingly, the characteristics of the semiconductor laser device 2 can be prevented from varying at contact with the measurement probe 8.

The control unit 7 sets the temperature of the heating-cooling device 1 and the temperature of the heating-cooling device 3 to the same value. In this state, the measurement probe 8 is brought into contact with the semiconductor laser device 2 when measurement is performed, and accordingly, heat can be prevented from flowing into or out of the semiconductor laser device 2 at contact with the measurement probe 8. As a result, measurement variance can be prevented from occurring due to variation of the characteristics of the semiconductor laser device 2.

In a conventional inspection apparatus, it is needed to move a measurement probe to a heating-cooling device and heat and cool the distal end of a probe each time measurement is performed. However, in the present embodiment, since the heating-cooling device 3 can heat and cool the measurement probe 8 through the probe holder 4, the measurement probe 8 does not need to be moved for heating and cooling.

With a conventional inspection apparatus in which a measurement probe is integrated with a heating device, it is impossible to control temperature to the low temperature side. Furthermore, it is impossible to allocate, near a probe, a space for providing a Peltier element and a cooling mechanism of water cooling or the like. However, in the present embodiment, the probe holder 4 is attached on the heating-cooling device 3. Accordingly, the heating-cooling device 3 can cool the measurement probe 8 through the probe holder 4.

The measurement probe 8 needs to have impedance matching for a high-frequency wave of several tens GHz. Accordingly, no freedom is available for designing of a probe needle of the measurement probe 8 and it is extremely difficult to extend the measurement probe 8 from the heating-cooling device 3 to the semiconductor laser device 2, and thus the probe holder 4 needs to be interposed therebetween. For this reason, the temperature difference from the semiconductor laser device 2 can be reduced when the difference between the temperature of the heating-cooling device 3 and the temperature of the distal end of the measurement probe 8 is as small as possible. Thus, the material of the probe holder 4 is preferably copper, aluminum, or the like having a thermal conductivity higher than 200 [W/m·K].

Embodiment 2

Figure 2:
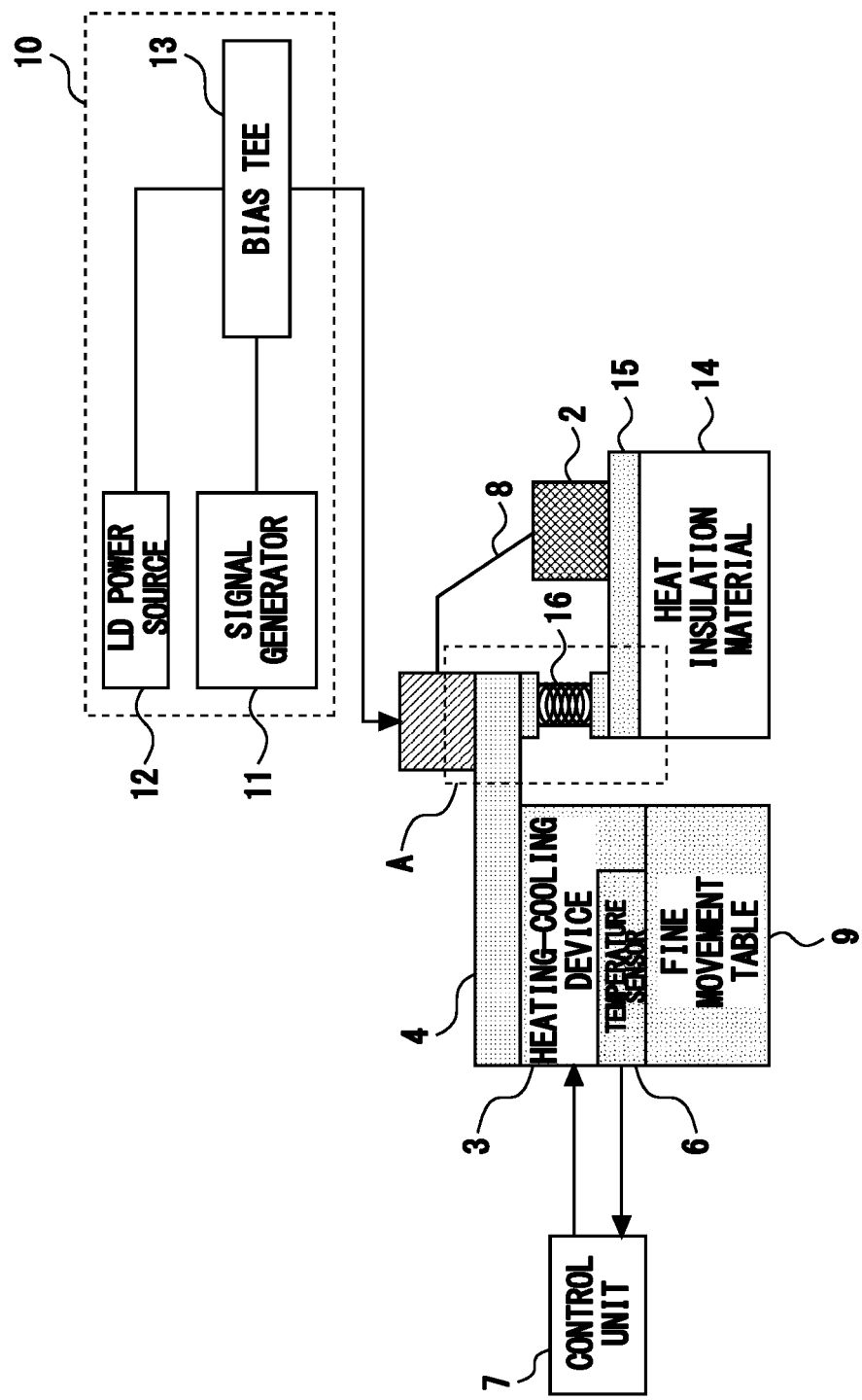
FIG. 2 is a block diagram illustrating a semiconductor laser inspection apparatus according to Embodiment 2.

FIG. 2 is a block diagram illustrating a semiconductor laser inspection apparatus according to Embodiment 2. When measurement is performed, the semiconductor laser device 2 is placed on a thin metal plate 15, which is provided on a heat insulation material 14, in place of the heating-cooling device 1 of Embodiment 1. One end of a spring 16 is connected to the upper surface of the metal plate 15, and the other end of the spring 16 is connected to the lower surface of the probe holder 4. The spring 16 thermally couples the metal plate 15 and the probe holder 4. The other configuration is the same as in Embodiment 1.

Figure 3:
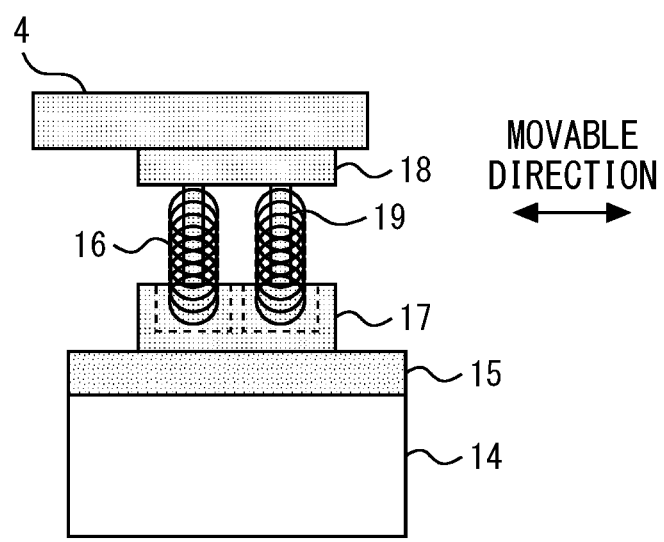
FIG. 3 is an enlarged side view of a region A surrounded by a dashed line in FIG. 2.

FIG. 3 is an enlarged side view of a region A surrounded by a dashed line in FIG. 2. A spring bracket 17 is fixed to the upper surface of the metal plate 15 by a screw or the like. A spring fixation member 18 contacts the lower surface of the probe holder 4. A spring fixation pin 19 is attached to the spring fixation member 18. The spring 16 is attached to the spring fixation pin 19. The outer shape of the spring fixation pin 19 and the inner diameter of the spring 16 are preferably as close to each other as possible so that the spring 16 is strongly fixed to the spring fixation pin 19 and heat is more likely to be transferred. The distal end of the spring 16 is inserted into the spring bracket 17 with the spring 16 being attached to the spring fixation member 18. In this state, the probe holder 4 is placed on the spring fixation member 18.

Heat from the probe holder 4 needs to be transferred to the metal plate 15. Thus, the spring 16, the spring bracket 17, the spring fixation pin 19, and the spring fixation member 18 are each preferably made of a metal having a thermal conductivity higher than 200 [W/m·h] and are preferably made of the same material to obtain the same linear expansion coefficient.

The spring fixation member 18 and the probe holder 4 are not fixed to each other, and thus the measurement probe 8 can be moved not only in the height direction but also in the horizontal direction with the spring fixation member 18 contacting the probe holder 4. To obtain movability, a contact part between the lower surface of the probe holder 4 and the spring fixation member 18 may be mirrored and lubricant may be applied to the contact part. To obtain thermal conductivity, heat conduction grease may be applied to the contact part. To prevent the spring 16 from protruding to a side, the depth of the spring bracket 17 is preferably deep enough that part of the spring fixation pin 19 is always in the spring bracket 17.

In the present embodiment, the probe holder 4 is attached on the heating-cooling device 3, and the spring 16 thermally couples the metal plate 15 and the probe holder 4. Thus, the temperature of the semiconductor laser device 2 and the temperature of the measurement probe 8 can be made close to each other by transferring heat from the one heating-cooling device 3 to the measurement probe 8 and the metal plate 15. Accordingly, the characteristics of the semiconductor laser device 2 can be prevented from varying at contact with the measurement probe 8.

Figure 4:
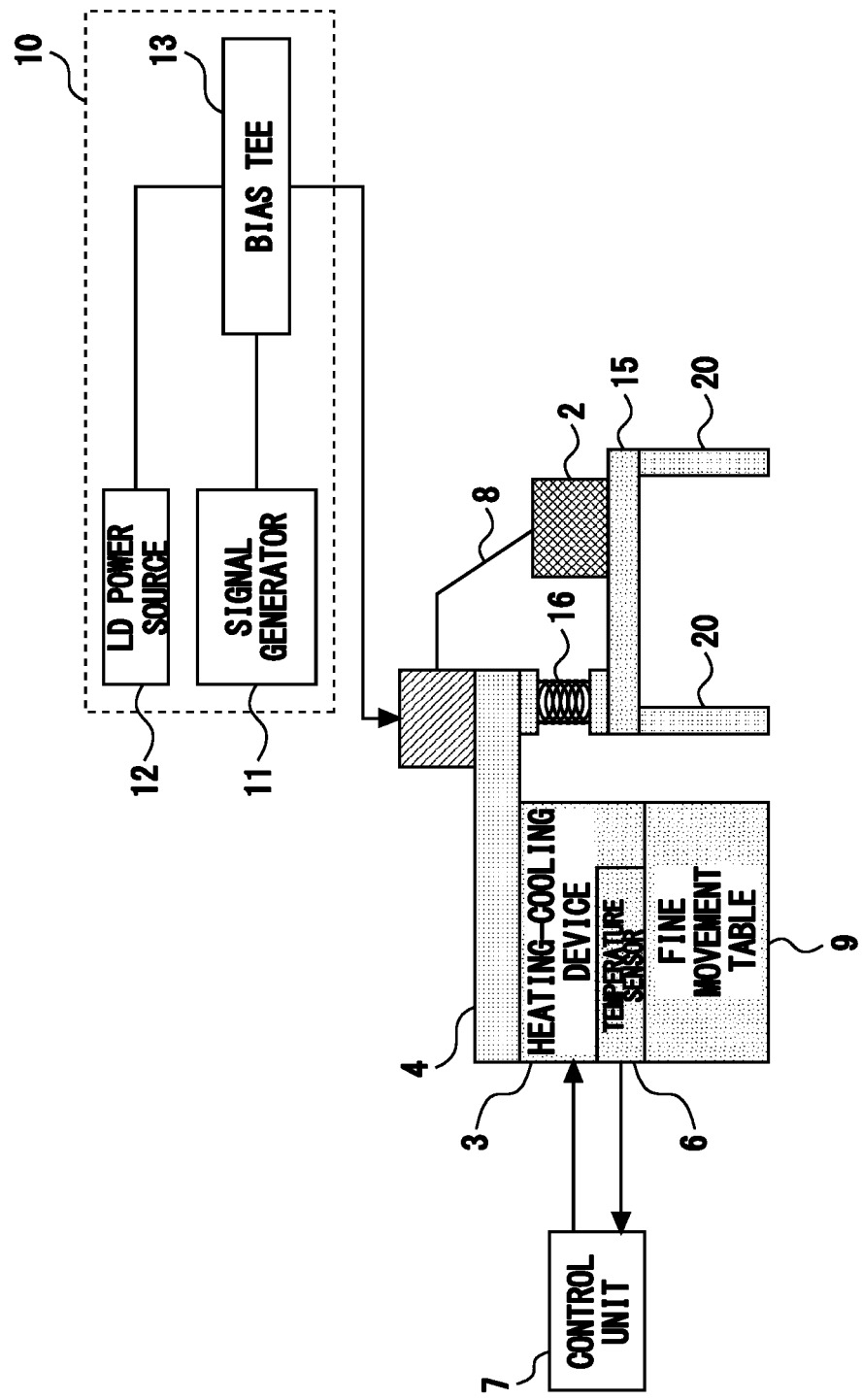
FIG. 4 is a block diagram illustrating a modification of the semiconductor laser inspection apparatus according to Embodiment 2.

FIG. 4 is a block diagram illustrating a modification of the semiconductor laser inspection apparatus according to Embodiment 2. Supports 20 are attached to four corners of the lower surface of the metal plate 15 in place of the heat insulation material 14 of Embodiment 2. A hollow space is provided below the metal plate 15. The material of the supports 20 is preferably resin, ceramic, or the like, which is less unlikely to transfer heat. The above-described effects can be obtained in this case as well.

Embodiment 3

Figure 5:
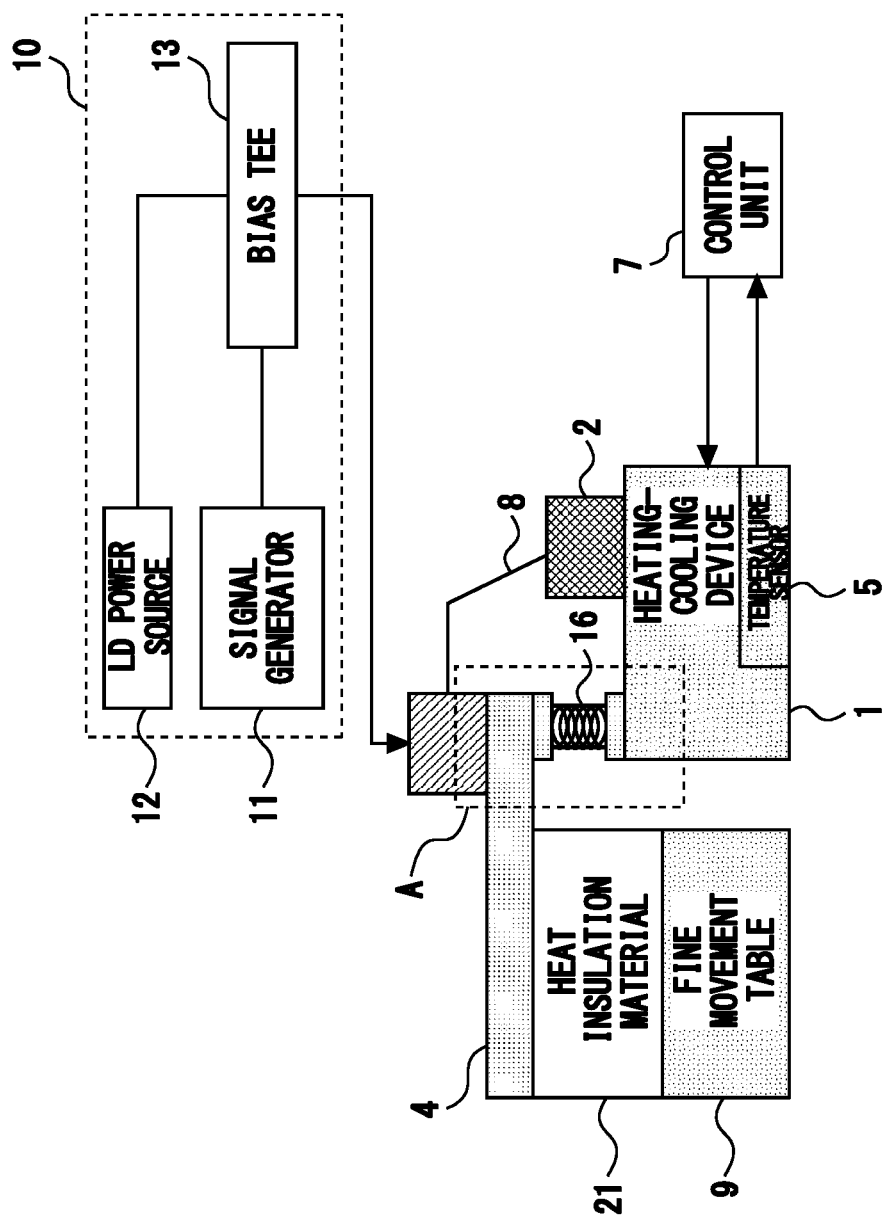
FIG. 5 is a block diagram illustrating a semiconductor laser inspection apparatus according to of Embodiment 3.

FIG. 5 is a block diagram illustrating a semiconductor laser inspection apparatus according to of Embodiment 3. The probe holder 4 is attached on a heat insulation material 21 in place of the heating-cooling device 3 of Embodiment 1. The fine movement table 9 moves the heat insulation material 21 and the probe holder 4 in the up-down direction and the horizontal direction. One end of the spring 16 is connected to the upper surface of the heating-cooling device 1, and the other end of the spring 16 is connected to the lower surface of the probe holder 4. The spring 16 thermally couples the heating-cooling device 1 and the probe holder 4. The other configuration is the same as in Embodiment 1.

Figure 6:
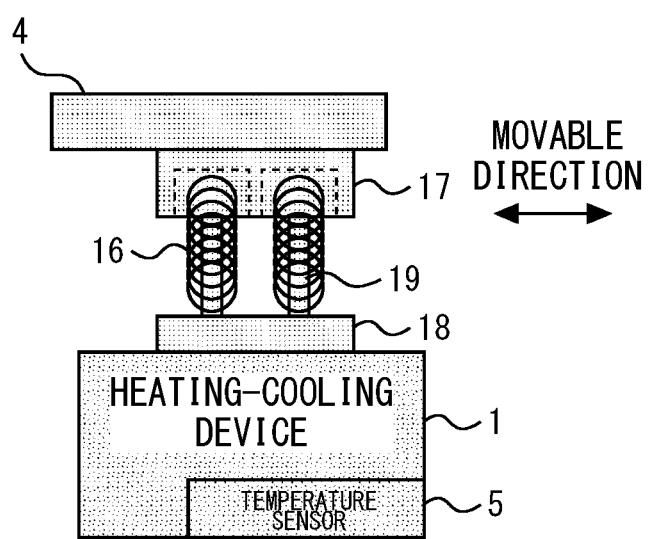
FIG. 6 is an enlarged side view of a region A surrounded by a dashed line in FIG. 5.

FIG. 6 is an enlarged side view of a region A surrounded by a dashed line in FIG. 5. The spring fixation member 18 is fixed to the upper surface of the heating-cooling device 1 by a screw or the like. The spring fixation pin 19 is attached to the spring fixation member 18. The spring 16 is attached to the spring fixation pin 19. The outer shape of the spring fixation pin 19 and the inner diameter of the spring 16 are preferably as close to each other as possible so that the spring 16 is strongly fixed to the spring fixation pin 19 and heat is more likely to be transferred. The spring bracket 17 contacts the lower surface of the probe holder 4. The distal end of the spring 16 is inserted into the spring bracket 17 with the spring 16 being attached to the spring fixation member 18. In this state, the probe holder 4 is placed on the spring bracket 17.

Heat from the heating-cooling device 1 needs to be transferred to the measurement probe 8. Thus, the spring 16, the spring bracket 17, the spring: fixation pin 19, and the spring fixation member 18 are each preferably made of a metal having a thermal conductivity higher than 200 [W/m·K] and are preferably made of the same material to obtain the same linear expansion coefficient. The probe holder 4 is made of a metal having a thermal conductivity higher than 200 [W/m·K] and preferably has a smaller size than in Embodiment 2 to reduce heat capacity so that heat is more likely to be transferred to the measurement probe 8.

The spring bracket 17 and the probe holder 4 are not fixed to each other, and thus the measurement probe 8 can be moved not only in the height direction but also in the horizontal direction with the spring bracket 17 contacting the probe holder 4. To obtain movability, a contact part between the lower surface of the probe holder 4 and the spring bracket 17 may be mirrored and lubricant may be applied to the contact part. To obtain thermal conductivity, heat conduction grease may be applied to the contact part. To prevent the spring 16 from protruding to a side, the depth of the spring bracket 17 is preferably deep enough that part of the spring fixation pin 19 is always in the spring bracket 17.

In the present embodiment, the spring 16 thermally couples the heating-cooling device 1 on which the semiconductor laser device 2 is placed and the probe holder 4. Thus, the temperature of the semiconductor laser device 2 and the temperature of the measurement probe 8 can be made close to each other by transferring heat from the heating-cooling device 1 to the measurement probe 8 through the spring 16 and the probe holder 4. Accordingly, the characteristics of the semiconductor laser device 2 can be prevented from varying at contact with the measurement probe 8.

Embodiment 4

Figure 7:
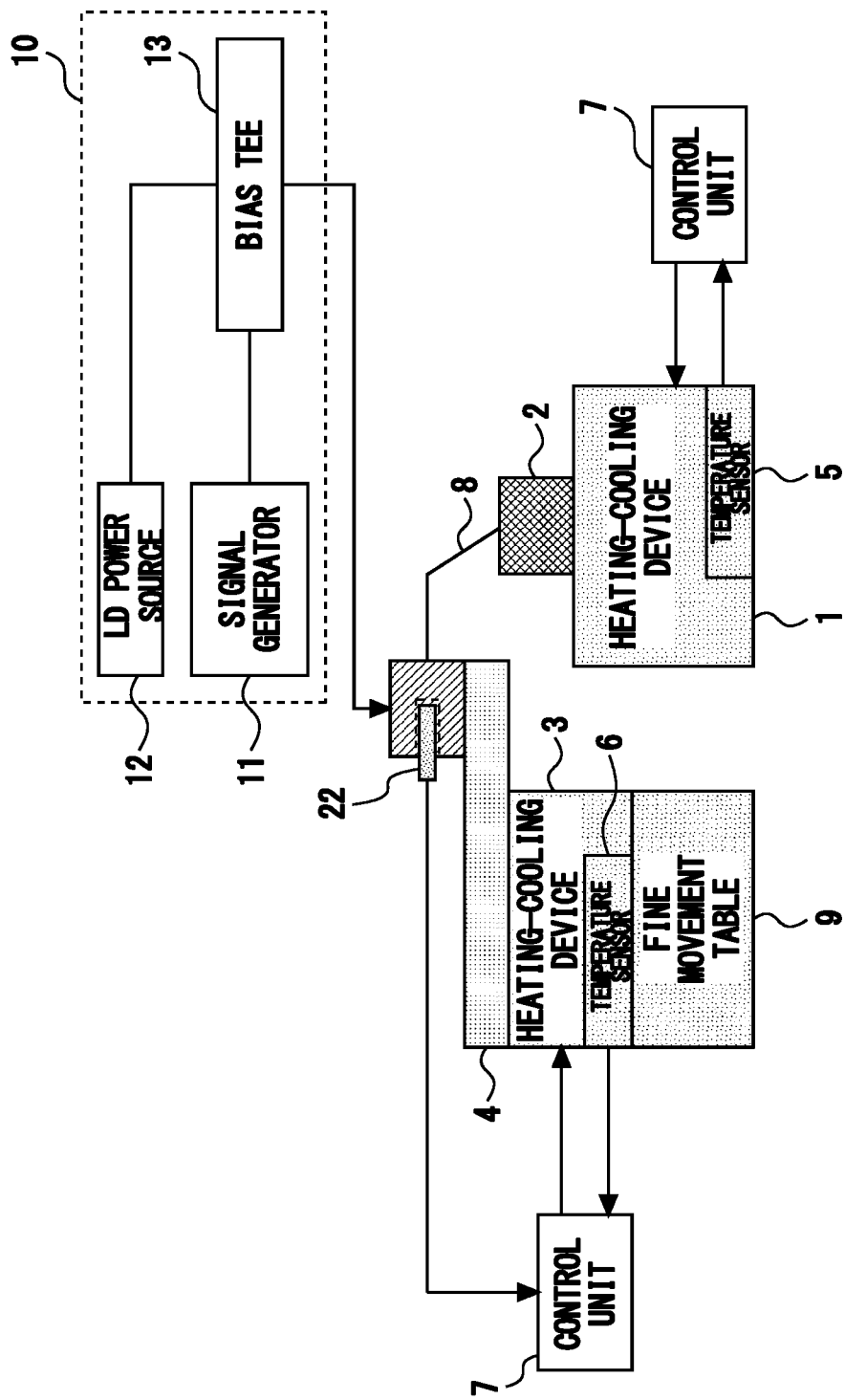
FIG. 7 is a block diagram illustrating a semiconductor laser inspection apparatus according to of Embodiment 4.

FIG. 7 is a block diagram illustrating a semiconductor laser inspection apparatus according to of Embodiment 4. A temperature sensor 22 is attached in a hole provided at the probe holder 4 or the measurement probe 8. The temperature sensor 22 measures the temperature of the measurement probe 8.

The temperature of the heating-cooling device 3 is adjusted in advance as described below before inspection of the semiconductor laser device 2 is started. The control unit 7 sets the heating-cooling device 1 and the heating-cooling device 3 to a temperature T at which product inspection is performed, and stabilizes the devices at the temperature. In this state, the temperature sensor 6 measures the temperature of the heating-cooling device 3 and the temperature sensor 22 measures the temperature of the probe holder 4. A value obtained by subtracting the temperature measured by the temperature sensor 22 from the temperature measured by the temperature sensor 6 is represented by $\alpha$. The control unit 7 resets the temperature of the heating-cooling device 1 to T and resets the temperature of the heating-cooling device 3 to T+$\alpha$.

Accordingly, the temperature of the measurement probe 8 becomes '1' ° C. and thus can be matched with the set temperature of the heating-cooling device 1 that sets the temperature of the semiconductor laser device 2. Thus, the temperature of the semiconductor laser device 2 and the temperature of the measurement probe 8 can be made closer to each other than in Embodiment 1. The other configuration and effects are the same as in Embodiment 1. Note that, since temperature measured by the temperature sensor 22 at measurement is not used, the temperature sensor 22 may be removed after adjustment of the set temperature of the heating-cooling device 3 is completed.

Embodiment 5

Figure 8:
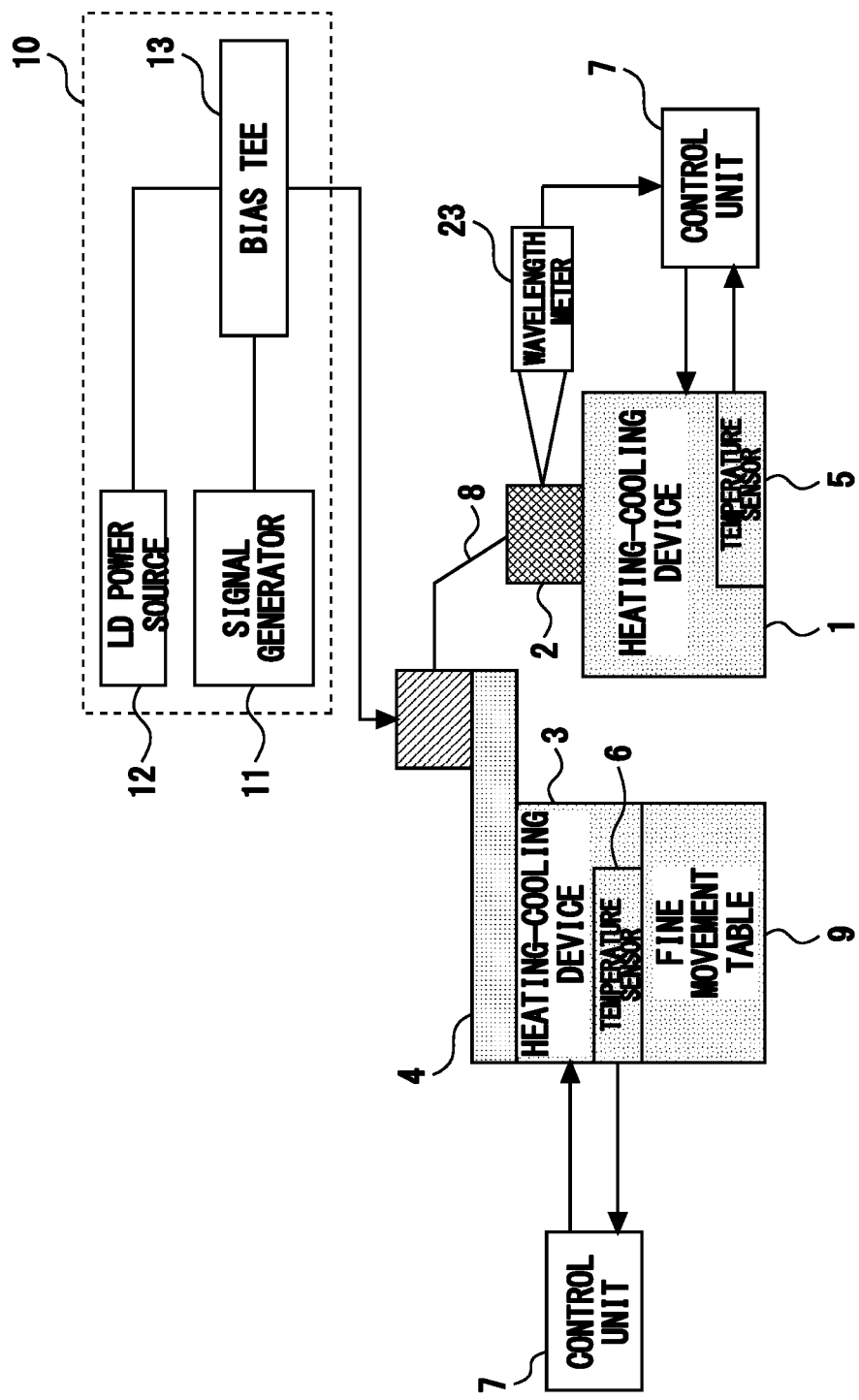
FIG. 8 is a block diagram illustrating a semiconductor laser inspection apparatus according to of Embodiment 5.

FIG. 8 is a block diagram illustrating a semiconductor laser inspection apparatus according to of Embodiment 5. A wavelength meter 23 configured to measure the wavelength of light emitted by the semiconductor laser device 2 is added to the configuration of Embodiment 1. The temperature of the heating-cooling device 3 is adjusted in advance as described below before inspection of the semiconductor laser device 2 is started.

Figure 9:
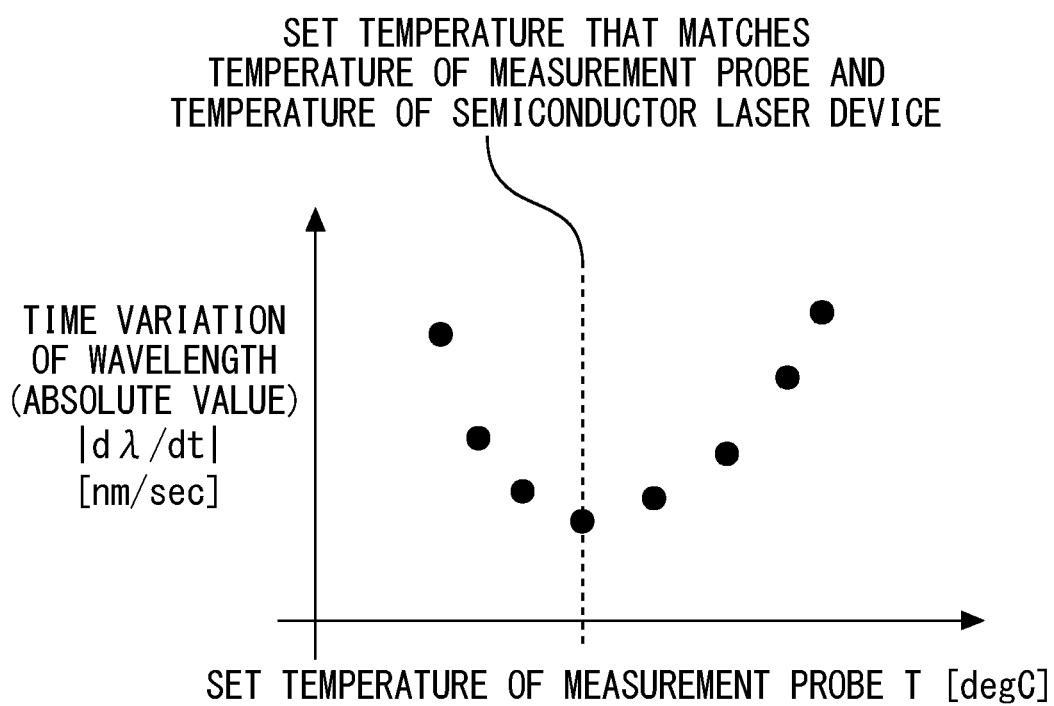
FIG. 9 is a diagram related to measurement of time variation of the wavelength of light emitted from the semiconductor laser device at the set temperature of the measurement probe.

The temperature of the heating-cooling device 3 is changed from T 10° C. to T 10° C. at the step of 1° C. for the set temperature T of the heating-cooling device 1. Time variation of the wavelength of light emitted from the semiconductor laser device 2 at contact with the measurement probe 8 is measured at each temperature. FIG. 9 is a diagram related to measurement of time variation of the wavelength of tight emitted from the semiconductor laser device at the set temperature of the measurement probe. The horizontal axis represents the set temperature of the measurement probe 8. The vertical axis represents the absolute value of time variation of the wavelength of light emitted from the semiconductor laser device 2 at contact with the measurement probe 8. The wavelength time variation is parabolic and has a local minimum point.

Subsequently, the wavelength time variation is acquired by changing the temperature of the heating-cooling device 3 from T'−1° C. to T'+1° C. at the step of 0.1° C., where T' represents temperature at which the wavelength time variation has a local minimum. With this measurement, a temperature T" at which the wavelength time variation has a local minimum is obtained. The control unit 7 sets the heating-cooling device 3 to the obtained temperature T".

The local minimum of the wavelength time variation with the heating-cooling device 3 set to the temperature T" means that the temperature of the semiconductor laser device 2 and the temperature of the measurement probe 8 are matched. The temperature of the semiconductor laser device 2 and the temperature of the measurement probe 8 can be made close to each other by performing the above-described adjustment. Accordingly, the characteristics of the semiconductor laser device 2 can be prevented from varying at contact with the measurement probe 8.

Embodiment 6

Figure 10:
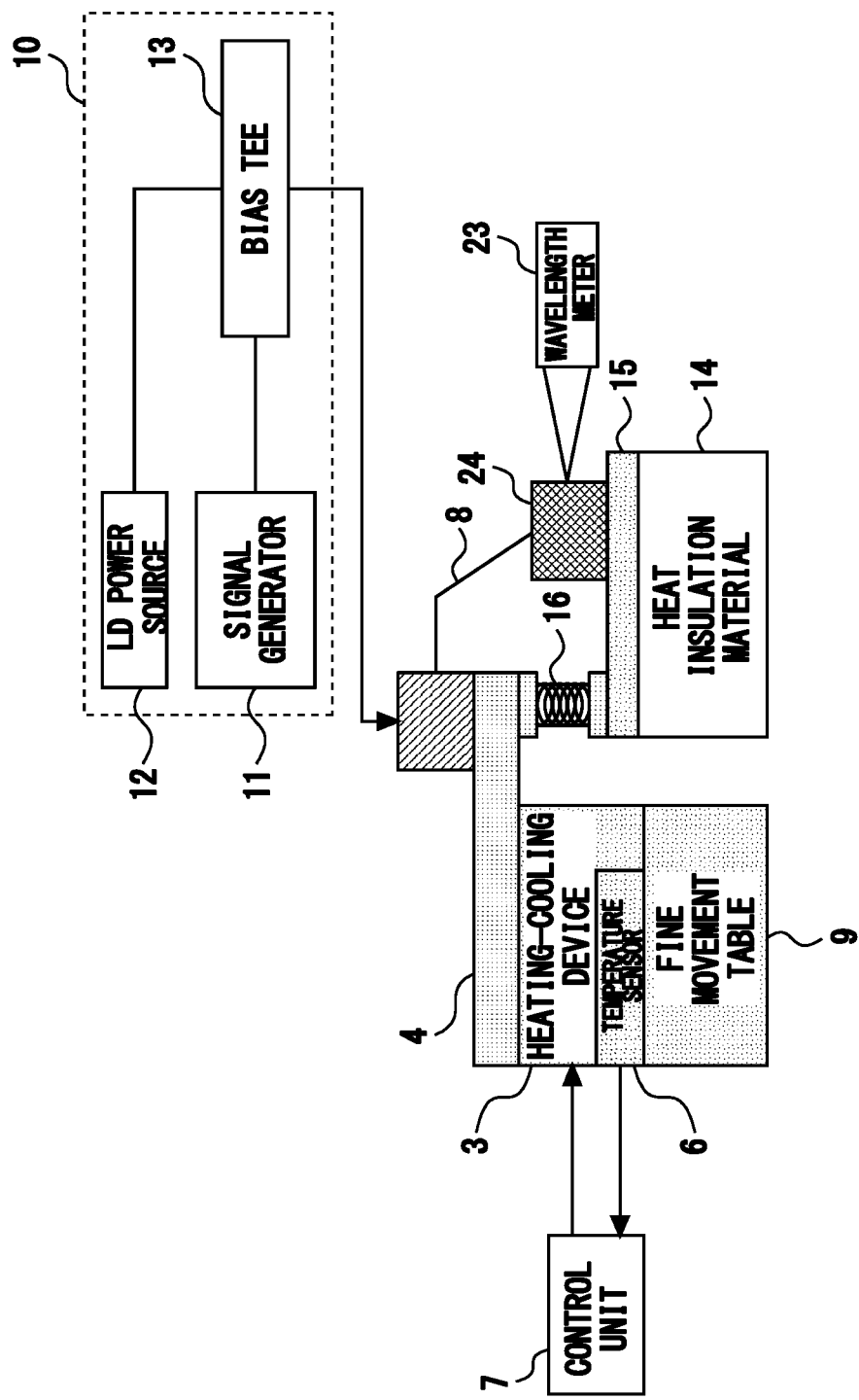
FIG. 10 is a block diagram for description of a semiconductor laser inspection method according to Embodiment 6.

FIG. 10 is a block diagram for description of a semiconductor laser inspection method according to Embodiment 6, The wavelength meter 23 configured to measure the wavelength of light emitted from a laser device placed on the metal plate 15 is added to the configuration of Embodiment 2. The temperature of the heating-cooling device 3 is adjusted in advance as described below before inspection of the semiconductor laser device 2 is started.

A temperature setting laser device 24 for which the relation between wavelength and temperature is known in advance is placed on the metal plate 15, the wavelength of light output from the temperature setting laser device 24 is measured by the wavelength meter 23 while the temperature of the heating-cooling device 3 is changed, and the temperature of the heating-cooling device 3 is fixed when the measured wavelength becomes a wavelength corresponding to a desired temperature.

After the temperature setting laser device 24 is removed from the metal plate 15, the semiconductor laser device 2 is placed on the metal plate 15 while the temperature of the heating-cooling device 3 is fixed. Then, similarly to Embodiment 2, inspection of the semiconductor laser device 2 is performed with the distal end of the measurement probe 8 brought into contact with the semiconductor laser device 2, Accordingly, it is possible to accurately match a temperature condition under which the semiconductor laser device 2 is inspected. The other configuration and effects are the same as in Embodiment 2.

Embodiment 7

Figure 11:
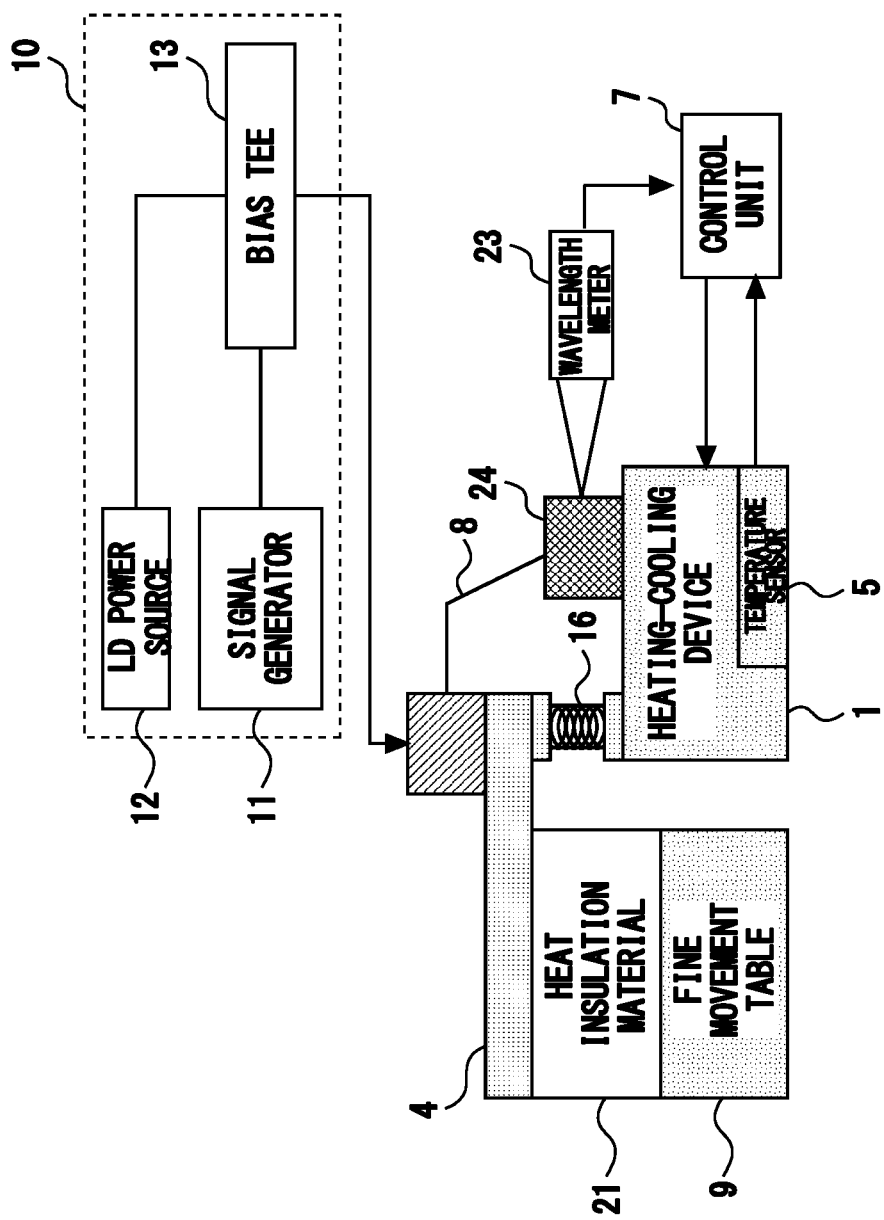
FIG. 11 is a block diagram for description of a semiconductor laser inspection method according to Embodiment 7.

FIG. 11 is a block diagram for description of a semiconductor laser inspection method according to Embodiment 7, The wavelength meter 23 configured to measure the wavelength of light emitted from a laser device placed on the heating-cooling device 1 is added to the configuration of Embodiment 3. The temperature of the heating-cooling device 1 is adjusted in advance as described below before inspection of the semiconductor laser device 2 is started.

The temperature setting laser device 24 for which the relation between wavelength and temperature is known in advance is placed on the heating-cooling device 1, the wavelength of light output from the temperature setting laser device 24 is measured by the wavelength meter 23 while the temperature of the heating-cooling device 1 is changed, and the temperature of the heating-cooling device 1 is fixed when the measured wavelength becomes a wavelength corresponding to a desired temperature.

After the temperature setting laser device 24 is removed from the heating-cooling device 1, the semiconductor laser device 2 is placed on the heating-cooling device 1 while the temperature of the heating-cooling device 1 is fixed. Then, similarly to Embodiment 3, inspection of the semiconductor laser device 2 is performed with the distal end of the measurement probe 8 brought into contact with the semiconductor laser device 2. Accordingly, it is possible to accurately match a temperature condition under which the semiconductor laser device 2 is inspected. The other configuration and effects are the same as in Embodiment 3.

REFERENCE SIGNS LIST 1 first heating-cooling device; 2 semiconductor laser device; 3 second heating-cooling device; 4 probe holder; 5,6,22 temperature sensor; 7 control unit; 8 measurement probe; 9 fine movement table; 10 inspection apparatus; 15 metal plate; 16 spring; 20 support; 23 wavelength meter; 24 temperature setting laser device.

The invention claimed is:

1. A semiconductor laser inspection apparatus comprising:
 a first heating-cooling device on which a semiconductor laser device is placed;
 a second heating-cooling device;
 a probe holder attached on the second heating-cooling device;
 a measurement probe fixed to a distal end of the probe holder;
 a fine movement table moving the second heating-cooling device and the probe holder so that a distal end of the measurement probe contacts the semiconductor laser device;
 an inspection apparatus inputting an inspection signal to the semiconductor laser device through the measurement probe;
 a wavelength meter measuring a wavelength of light emitted from the semiconductor laser device; and
 a control unit obtaining temperature at which wavelength time variation of the light emitted from the semiconductor laser has a local minimum at contact with the measurement probe when temperature of the second heating-cooling device is changed for set temperature of the first heating-cooling device, wherein the control unit sets the second heating-cooling device to the obtained temperature.

2. The semiconductor laser inspection apparatus according to claim 1, wherein the probe holder has a thermal conductivity higher than 200 [W/m·K].

* * * * *